United States Patent [19]

Domogalla

[11] 4,333,025
[45] Jun. 1, 1982

[54] N-CHANNEL MOS COMPARATOR

[75] Inventor: John C. Domogalla, Missouri City, Tex.

[73] Assignee: Texas Instruments Incorporated, Dallas, Tex.

[21] Appl. No.: 886,191

[22] Filed: Mar. 13, 1978

[51] Int. Cl.³ .............................................. H03K 5/24
[52] U.S. Cl. ................................... 307/355; 307/362; 307/DIG. 3
[58] Field of Search .................. 307/355, 362, DIG. 3

[56] References Cited

U.S. PATENT DOCUMENTS

| | | | |
|---|---|---|---|
| 4,004,170 | 1/1977 | Henke | 307/355 X |
| 4,027,176 | 5/1977 | Heuber et al. | 307/DIG. 3 X |
| 4,045,686 | 8/1977 | Masuda | 307/355 |
| 4,096,402 | 6/1978 | Schroeder et al. | 307/362 |
| 4,130,897 | 12/1978 | Horne et al. | 307/DIG. 3 X |

Primary Examiner—Larry N. Anagnos
Attorney, Agent, or Firm—John G. Graham

[57] ABSTRACT

A voltage comparator circuit suitable for a semiconductor integrated circuit device comprised of a variable impedance being controlled by input voltages that are to be compared with one another and a feedback circuit comprised of a pair of cross-coupled transistors each having a gain of unity to provide a differential signal of infinite gain to a single ended output circuit.

1 Claim, 2 Drawing Figures

N-CHANNEL MOS COMPARATOR

FIELD OF THE INVENTION

This invention relates to a voltage comparator circuit, and more particularly, to a voltage comparator circuit which employs a feedback circuit for providing a differential signal of infinite gain.

DESCRIPTION OF THE PRIOR ART

A differential comparator may be described as a circuit having a differential-input, single-ended output, high gain amplification operating in the nonlinear region that is used to compare a voltage applied to one of its input terminals to a reference voltage applied to its other input terminal. The output will be a digital "one" or "zero" when one input is higher than the other. One such voltage comparator circuit is described in U.S. Pat. No. 4,045,686.

The voltage comparator circuit of the prior art comprises a pair of time constant circuits each of which includes a variable impedance, such as a depletion type MISFET, and a capacitor, the variable impedance being controlled by input voltages which are to be compared with one another and a flip-flop circuit which is stabilized to predetermined values on the basis of the comparison between the time variations of the outputs of the time constant circuits.

SUMMARY

A fundamental construction of this invention is characterized by a feedback circuit comprised of a pair of cross-coupled MOS transistors each sized for a gain of unity to provide a differential signal having infinite gain. A reference voltage and a sample voltage are applied to the gates of MOS transistors connected in parallel, one on each side of the feedback circuit. A differential input causes the feedback circuit to output a differential signal having infinite differential gain. The differential output is fed to a single-ended output circuit which outputs a digital "zero" or "one" representative of which compared signal has the larger magnitude. The MOS comparator circuit operates on a single low voltage supply.

An object of the present invention is to provide a comparator circuit having a differential-input, single-ended output and infinite differential gain.

Another object of the present invention is to provide an N-channel MOS comparator having a differential voltage input, a feedback circuit for providing infinite differential gain and a single-ended digital output circuit operating from a single low voltage supply.

BRIEF DESCRIPTION OF THE DRAWINGS

The invention, together with its various features and advantages, can be easily understood from the following, more detailed description taken in conjunction with the accompanying drawings in which.

DETAILED DESCRIPTION OF THE INVENTION

Figure 1:
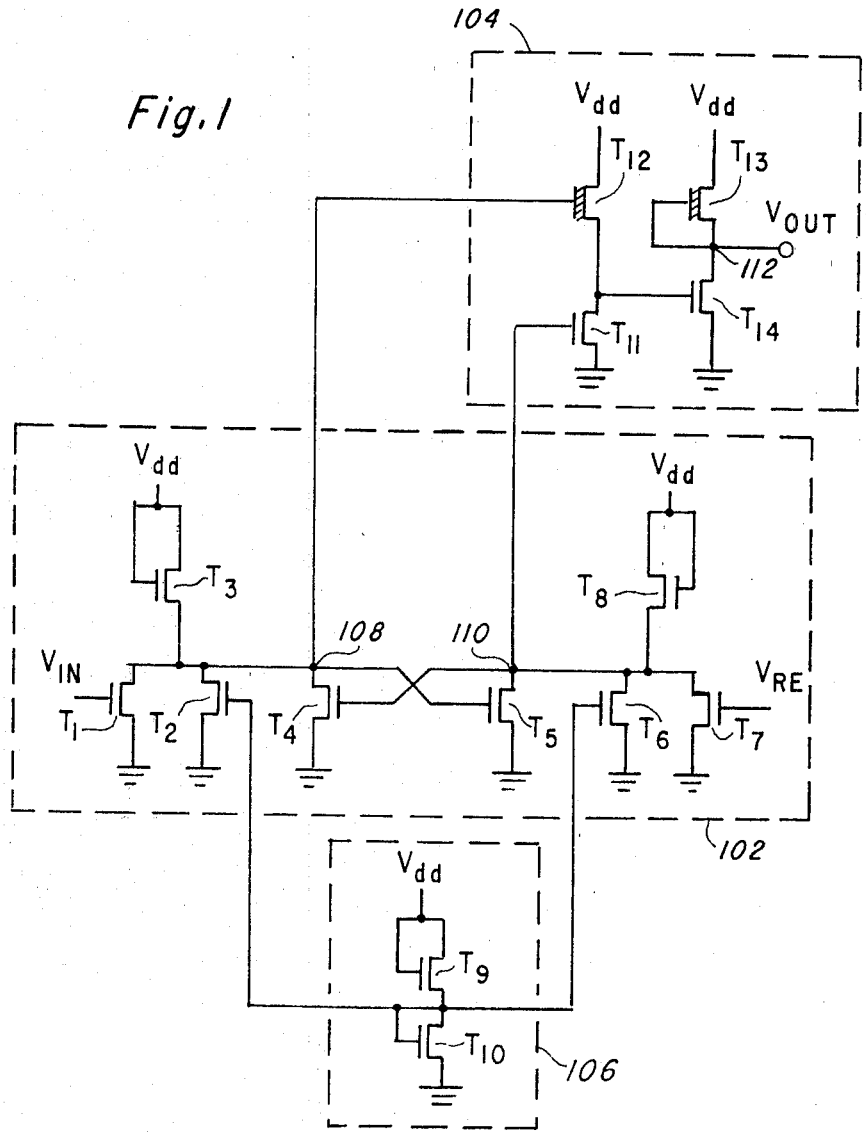
FIG. 1 is a circuit diagram which shows a single stage embodiment of the voltage comparator circuit according to this invention.

In FIG. 1 the single stage voltage comparator circuit is divided into three functional circuits 102, 104 and 106. Circuit 102 comprises a single stage differential voltage input circuit, circuit 104 comprises a single ended digital output circuit and circuit 106 comprises a voltage divider.

The differential-input circuit 102 may be subdivided into a reference voltage input circuit and a sample voltage input circuit, each of these two input circuits being of matched design. The reference voltage input circuit comprises three MOS transistors T5, T6 and T7 having their respective drains connected in parallel to the source of a common load transistor T8. The sources of the transistors are connected to a common ground. Transistors T5, T6 and T7 are connected to a common power supply terminal $V_{dd}$ through the load transistor T8.

Transistor T7 acts as a variable impedance providing for the input of the reference voltage. Transistor T6 is a sourcing transistor used to source the extra current necessary to hold the system at its operating point thereby biasing the circuit. Transistor T5 is the feedback transistor providing for the high differential gain.

The source voltage input circuit also comprises three like transistors T1, T2 and T4 connected in parallel to a common load transistor T3. The transistors also have their respective sources connected to a common ground. Each of these transistors T1, T2 and T4 is connected to a common power supply terminal $V_{dd}$ through load transistor T3. Transistor T1 acts as a variable impedance for inputting the sample voltage applied to its gate to be compared with the reference voltage. Transistor T2 is another sourcing transistor as previously described and transistor T4 is a feedback transistor. The two feedback transistors T4 and T5 are cross coupled, gate to drain, thereby connecting the two subcircuits together.

The gate voltage for the sourcing transistors T2 and T6 are supplied by the voltage divider circuit 106. The voltage divider circuit comprises two transistors T9 and T10 connected in series between power supply terminal $V_{dd}$ and ground. The transistors have their gates connected to their drains to provide resistor devices. The divided voltage is taken from the source to drain connection of transistors T9 and T10 and applied to the gates of transistors T2 and T6 respectively.

The differential output from the differential voltage input circuit 102 is fed to the single-ended digital output circuit 104. All transistors described to this point have been of the enhancement type. The differential output from circuit 102 is applied to the gates of enhancement transistor T11 and depletion transistor T12 that are connected together in series between voltage supply terminal $V_{dd}$ and ground. A single output is taken from the drain of transistor T11 and applied to the gate of an enhancement transistor T14 that is connected in series with a depletion type transistor T13 between a common voltage supply terminal $V_{dd}$ and ground. The depletion transistor T13 has its gate short circuited to its source. A single-ended digital output is removed from the source-drain connection between transistors T13 and T14.

Figure 2:
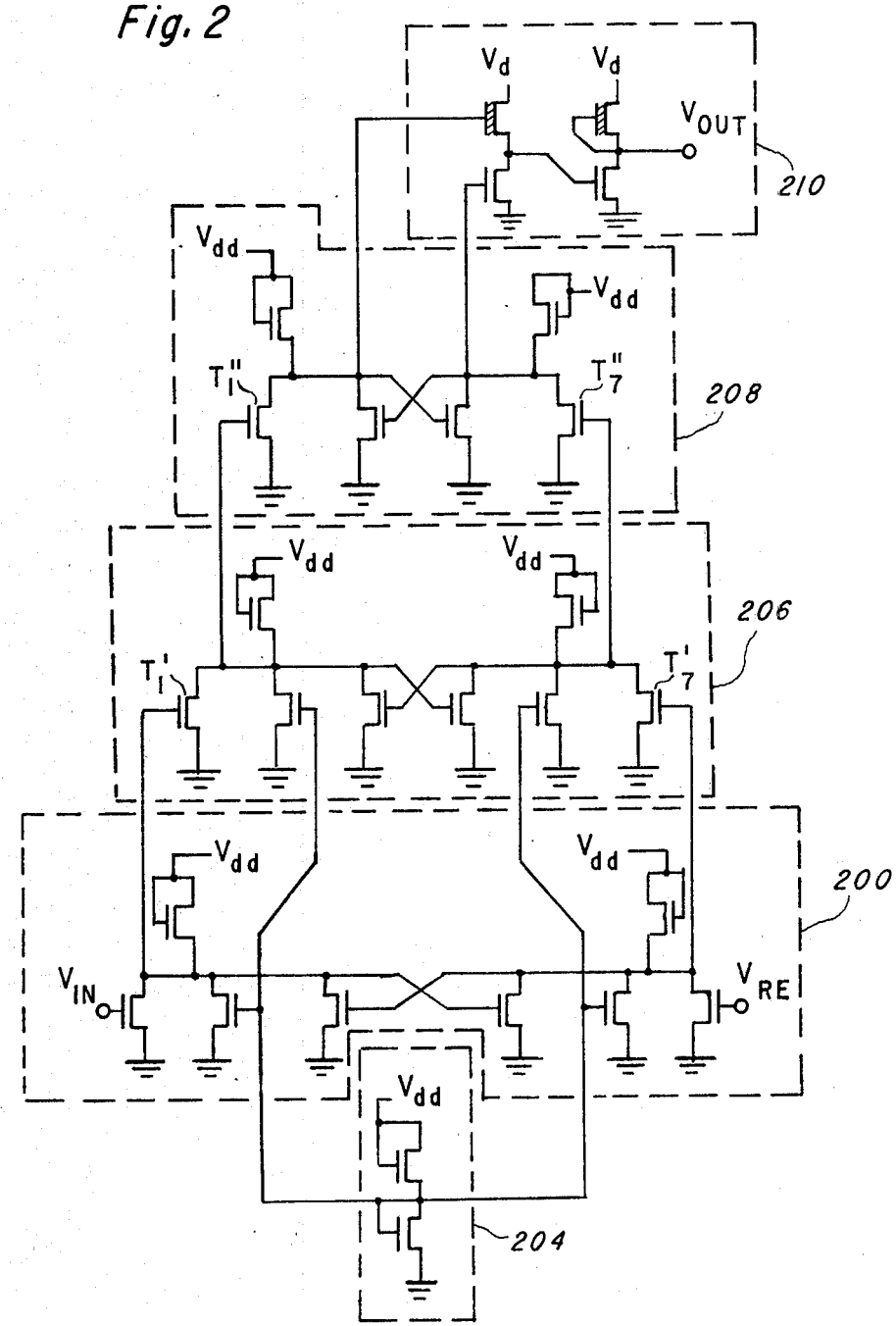
FIG. 2 is a circuit diagram which shows a multistage embodiment of the voltage comparator circuit according to this invention.

In FIG. 2 a three stage MOS voltage comparator circuit is schematically drawn. The voltage divider circuit 204 is as previously described; the first and second stages of the differential voltage input circuits 200 and 206 are as previously described; the third stage of the differential input circuit 208 is as previously described excepting the sourcing transistors have been eliminated; and the single-ended digital output circuit 210 is as previously described. The differential output from the first stage is applied to the gates of the variable impedance input transistors T1' and T7' respectively. In a like manner the differential voltage output from the second stage 206 is applied to the gates of the variable impedance input transistors T1'' and T7'' respectively of the third stage of the voltage comparator circuit. It can be noted that all of the transistors can be tied to a common ground as well as having a single supply voltage terminal $V_{dd}$.

It can be shown that the relationship between the differential gain of the comparator circuit with that of the gain of the variable impedance transistors T1 and T7 and the feedback transistors T4 and T5 is defined by the following relationship:

Differential Gain (Gd) = −A/(1−B)

where differential gain of the stage (Gd) is defined as the change in differential output voltage divided by the change in differential input voltage. The gain of a transistor is defined as the delta drain voltage divided by the delta gate voltage, therefore the term "A" represents the magnitude of gain for the input transistors T1 and T7, and the term "B" is the magnitude of gain for each of the two feedback transistors T4 and T5. It is to be noted that the gain magnitude of the feedback transistors approach unity as the gain of the stage goes to infinity regardless of the gain of the input transistors.

In the preferred embodiment of the present invention, the feedback transistors T4 and T5 are sized for a magnitude of gain of unity. If the magnitude of the feedback gain is allowed to be greater than unity the circuit will exhibit an offset proportional to the amount allowed, which at the extremes, causes the circuit to latch. It is to be understood to one skilled in the art that the magnitude of the feedback gain of transistors T4 and T5 can be less than unity, such as one half, and still have utility with the method of the present invention excepting that the magnitude of gain will not approach the optimum of infinity. The input transistor T1 and T4 are sized for a gain that will allow the desired common mode input voltage without taking the circuit from its proper operating point. The common mode voltage is the region in which the two input voltages can be compared. In one embodiment the comparator circuit can be designed to compare two voltages in the range of 1.5 to 2.5 volts. In another embodiment the circuit can be designed for input voltages in the range of 10 to 15 volts. It is apparent to one skilled in the art that the comparative circuit can be designed for any range of voltages desired.

Transistors T2 and T6 have been referred to as sourcing transistors. As transistors T1 and T4 have been sized for gain against the load transistor T3, it is possible that these transistors cannot pull enough current from the load to hold the system in an operating range. Accordingly, source transistor T2 is sized to provide enough current to maintain the proper bias point thereby holding the system at its operating point. Transistor T6 is sized in a like manner. In addition, the source transistors provide some temperature compensation as their gates are tied to a voltage reference that tracks the amplifier voltage bias with temperature.

These source transistors are particularly important in the stages where there is a very small voltage differential and therefore a very sensitive circuit is required. However, as the voltage differential increases due to the gain of each stage the source transistors may be eliminated as indicated in FIG. 2 for the third stage circuit 208.

Operation

In FIGS. 1 or 2, if the reference voltage $V_{re}$ and the sample voltage $V_{in}$ are of equal potential when applied to the gates of transistors T1 and T7, equal current will flow through the respective transistors to ground as transistors T1 and T7 are sized having equal resistance. As this occurs the voltage potential at nodes 108 and 110 will fall below the value of the power supply voltage $V_{dd}$ to a lower value with both nodes 108 and 110 being at equal potentials. Since node 108 is connected to the gate of feedback transistor T5 and node 110 is connected to the gate of feedback transistor T4 and where transistors T4 and T5 are sized for the same gain, the output potential from the cross-coupled feedback transistors will be equal.

As the sample voltage $V_{in}$ becomes higher than the reference voltage $V_{re}$ more current will flow through transistor T1 thereby lowering the potential at node 108 to a potential lower than the potential at node 110. As node 108 is connected to the gate of feedback transistor T5, this transistor begins to turn off while feedback transistor T4 begins to turn on more as its gate is connected to node 110 which is now at a higher potential than the potential at node 108. In this manner, node 110 starts to go higher as node 108 starts to go lower. This feedback cycle will continue indefinitely such that node 110 will give a high potential indication and node 108 will give a low potential indication. The differential gain will approach unity where the feedback transistors are sized for a gain of unity as previously described. The high output from node 110 is applied to the gate of transistor T11 and the low output is applied to the gate of depletion type transistor T12. Transistor T11 having a high potential applied to its gate is now turned on. Transistor T12 is sized so as not to be turned off by a low signal at its gate but to only have a high resistance. In this manner a low signal is applied to the gate of transistor T14 thereby keeping it turned off. Since transistor T13 is normally on, the output $V_{out}$ is at a high potential defining a digital 1 signal.

In a similar manner if $V_{in}$ is lower than the reference voltage, node 108 will go high and node 110 will go low. Transistor T11 will be shut off, while transistor T12 which is of the depletion mode will be conductive. The gate of transistor T14 will now be high resulting in current flow to ground thereby pulling down the potential at node 112 causing a low potential output defining a digital 0 signal.

The comparator circuit has been described for a single stage circuit. FIG. 2 indicates a three stage circuit as previously described whose operation is identical to that described for a single stage. The potential output of each stage is applied to the gates of the variable impedance input transistors of the next stage. The only noted difference is that the potential inputs are the inverse of the potential inputs of the previous stage.

The circuit of the embodiments described have been utilized as a voltage comparator. It is apparent to those skilled in the art that the circuit described also function as an operational amplifier as it performs many of the same functions such as, differential inputs, single output and open loop gain of infinity. It is therefore apparent to those skilled in the art that as an operational amplifier the circuit could be utilized as a voltage follower, a linear amplifier, and an analog differentiator or integrator.

While particular embodiments to this invention have been disclosed herein, it will be understood that various modifications may become apparent to those skilled in the art without departing from the spirit and scope of the invention which is defined by the appended claims.

What is claimed is:

1. A voltage comparator circuit comprising:

first and second control devices each having a current path and a control electrode, first and second input terminals to which first and second voltages to be compared with one another are respectively applied; means connecting said input terminals to said control electrodes of said first and second control devices, respectively;

first and second sourcing means each connected in parallel to the current path of a respective one of said first and second control devices, said sourcing means providing current sources;

first and second outputs defined at one end of said current paths of said control devices and providing a differential voltage of said first and second voltages;

a single ended output circuit having first and second inputs connected to said first and second outputs for receiving said differential voltage, said output circuit providing an output voltage representative of which of said first or second voltages has the larger magnitude;

feedback means comprising a pair of cross-coupled MOS transistors each sized for a magnitude of gain of about unity to provide a magnitude of differential gain of about infinity, said MOS transistors including source-to-drain paths respectively connected in parallel with the current paths of said first and second control devices; and a voltage divider circuit connected to said first and second sourcing means, said voltage divider supplying the voltage operative of said sourcing means.

* * * * *